United States Patent [19]

Bickler

[11] 4,388,346

[45] Jun. 14, 1983

[54] ELECTRODES FOR SOLID STATE DEVICES

[76] Inventor: James M. Beggs, Administrator of the National Aeronautics and Space Administration, with respect to an invention of Donald B. Bickler, Temple City, Calif.

[21] Appl. No.: 325,083

[22] Filed: Nov. 25, 1981

[51] Int. Cl.³ ............................................. H05K 3/12
[52] U.S. Cl. ......................................... 427/58; 427/75; 427/88; 427/96; 427/216; 427/217; 427/226; 427/376.6; 427/376.7; 427/436; 427/437
[58] Field of Search ....................... 427/75, 88, 58, 96, 427/216, 217, 226, 376.6, 376.7, 436, 437

[56] References Cited

U.S. PATENT DOCUMENTS 4,219,448  8/1980  Ross ...................................... 427/88
4,235,644  11/1980 Needes .................................. 427/75
4,336,281  6/1980  von Mourik ........................... 427/75

FOREIGN PATENT DOCUMENTS 49-4057  1/1974  Japan .................................... 427/96

Primary Examiner—John D. Smith
Attorney, Agent, or Firm—Paul F. McCaul; John R. Manning; Thomas H. Jones

[57] ABSTRACT

Contact electrodes on a semiconductor device (50) such as a photovoltaic solar cell is formed by screening through a mask (38) onto a surface (40) a pattern of ink containing a dispersion of lower melting, sinterable metal (tin) coated base metal (copper) particles dispersed in a liquid vehicle including a vaporizable binder polymer and a fluorocarbon polymer. On firing the screen coated device (46) in an oven (48) the binder polymer is vaporized, the fluorocarbon vapors etch the surface and the coated metal particles sinter without being oxidized to form an adherent, coherent, contact electrode (53).

11 Claims, 6 Drawing Figures

ELECTRODES FOR SOLID STATE DEVICES

ORIGIN OF THE INVENTION

The invention described herein was made in the performance of work under a NASA contract and is subject to the provisions of Section 305 of the National Aeronautics and Space Act of 1958, Pulic Law 83-568 (72 Stat 435; 42 USC 2457).

DESCRIPTION

1. Technical Field

The present invention relates to coated metal powders and to dispersions of such powders in liquid vehicles forming a printing paste utilized in forming electrode contacts on solid state devices. More particularly, the invention relates to screenable, sinterable pastes for use in forming electrodes on photovoltaic devices.

2. Background Art

Oil and gas, the present dominant energy sources are non-renewable and are subject to political manipulation and to large disruptions in price structure and supply by agreements between producing nations. Nuclear fusion is a near term alternative for production of electricity but also suffers from long term exhaustion as a resource and is objectionable due to environmental concerns relating to radiation leakage to personnel or to the environment near population center, the possibility of a catastrophic release of energy and also the problem of disposal of spent fuel. The only real non-renewable resource is the sun. Solar energy is the basis of power generation in such forms as water power, wind power, biomass and electrical power generation. The present invention is based on direct electrical power generation by capture and conversion of solar into electric by means of photovoltaic devices.

Although solar energy is available at no cost, photovoltaic conversion is plagued by high cost. Part of the high cost is due to the low density of solar energy. Under fairly favorable conditions, the incident solar energy is about one $kW/cm^2$. At the present state of the art conversion efficiency of 12%, the generation of one kW of energy would require 7.7 $m^2$ of photovoltaic surface collection area. Many factors reduce the efficiency. If the incident solar energy is not perpendicular, the non-perpendicular component of the energy is lost. Weather conditions such as haze, fog or clouds can reduce the amount of incident solar energy and, of course, there is no solar energy available during night time hours.

Photovoltaic solar energy systems producing energy at a cost of $50,000 or more per kilowat were justified for the space program because they were necessary. Intensive research and development has dropped the cost by a factor more than 4 in the past several years but in order to be competitive solar panel costs of $500 or less per kilowat will be required.

Efficiency and cost of surface contacts for electrodes are not satisfactory. The front contact of a solar cell has a major influence on the efficiency of a cell. This contact is usually provided in a thin, comb-like pattern to allow for maximizing reception and conversion of the incident solar energy. The pattern of the contact must be designed in such a manner so as to optimize surface coverage and series resistance. The materials used for this contact must be highly conductive electrically and have limited junction interaction but be adherent to the base material, usually silicon. Very thin, closely spaced and highly conductive silver grid lines are utilized for front contact. In earlier devices, this contact was applied by vacuum evaporation, a very expensive process, not readily adaptable to mass production. Since silver does not adhere to the native silicon surface, screen-printed silver pastes comprising silver particles and glass frit suspended in an organic vehicle are utilized. Printing this paste through a screen achieves adherent narrow and thin grid lines with relatively large surface coverage.

During sintering at 700° C. the glass frit melts and flows and adheres to the native silicon or silicon oxide surface. In another related process designed to decrease line width, a photoresist is applied which upon exposure to ultraviolet light becomes hard and dry. The masked, non-exposed pattern remains sticky and tacky. Upon application of dry powdered metal and glass frit a pattern is formed. On firing the resist resin is converted to ash while the conductive powder and glass frit sinters to form adherent silver lines.

The screen printing techiques have the advantages of automation and high through-put which can reduce cost per device. However, the screen printing technology was developed for printing on ceramic substrates and the high temperatures required, about 700° C., are too high for the temperature-labile, silicon photo-voltaic cell substrate. The contact metal can diffuse into the very shallow, adjacent junction region causing shorting. Furthermore, silver only partially compacts as it flows over the glass particles and the density of the sintered silver is such that the conductivity of the electrode is only one third that of bulk silver. Frits containing both Group III and Group V metals can interfere with local carrier concentration in the junction region and reduce specific contact resistance. Finally, silver being a precious metal is fairly expensive and is subject to wide fluctuations in price.

It would be desirable to be able to use lower cost metals such as nickel or copper. However, copper can diffuse very quickly into the junction region, especially at the 700° C. firing temperatures required to melt the glass frit present in the current printing pastes. Another problem with copper and nickel powders is that they are readily oxidized during firing to form a thick oxide skin which significantly increases the resistance of the contact electrode and prevents the individual grains from flowing and wetting the surface of the device.

In one attempt to form a screenable copper or nickel printing paste without glass frit, a paste was formed of a mixture of copper and a low melting non-oxidizing sinterable metal such as tin or lead were dispersed in an oily carrier. On firing it was intended to form an eutectic alloy which would flow over the surface and solidify. A flux such as a fluoride could be present to etch the surface to improve adherence. During firing not all of the copper grains were wetted and coated and some were oxidized to a higher resistance copper oxide. Other copper grains can diffuse too deeply into the junction region interfering with the carrier concentration. Thus the final, fired contact is very non-uniform. The process is not suitable for industrial application due to the poor and unpredictable quality of the resulting contact electrodes.

SUMMARY OF THE INVENTION

It has now been discovered in accordance with the invention that lower cost, conductive powders such as copper and nickel that usually form thick metal oxide films during firing can be successfully and reliably utilized as the base metal in screenable pastes used to form contacts on solid state devices. The electrode forming composition of the invention does not require the presence of any glass frit and results in the formation of an adherent, uniform, low resistance contact.

In accordance with the invention, the primary nickel or copper metal particles are provided with a coating of lower melting sintering metals such as 1–20% by weight, of a non-oxidizing metal such as lead or tin.

The powdered metal systems operate on the basis of fusing together by way of eutectic alloying. As the paste is heated during firing the organic binder is first vaporized. An eutectic of the base metal (copper) and coating (tin) forms at the intersections of the base metal grains. This eutectic dissolves the grains and as the temperature is raised above the eutectic temperature, more of the base metal is dissolved. While the temperature is held at the higher value, the much smaller amount of sintering metal disappears as the eutectic dissolves and diffuses into the base metal until the composition of the eutectic is so enriched with base metal that it no longer has the eutectic properties and it solidifies. In this high temperature solidification, the base metal grains become thoroughly alloyed together and will not separate at the eutectic temperature (a lower temperature than their solidification by diffusion).

In order to provide thick, conductive films and to be able to print thin lines having good resolution, the primary copper or nickel grains metal should have a small particle size from 1 to 100 microns, preferably from 2 to 40 microns. The grains of primary metal can be an alloy of copper. It has further been discovered that in order to provide individual grains capable of being dispersed in a fugitive, vaporizable binder, the application of the sintering metal must be effected by electroless coating procedures. Attempts to coat electrolytically result in a joined mass of metal particles. The coated particles are then dispersed in an amount of from 50 to 85% by weight solids in a binder.

The vaporizable binders are well known in the art for forming screenable paste and may be a cellulose derivative such as ethyl cellulose dissolved in butyl carbitol solvent or preferably an acrylic binder containing a minor amount of polyvinyl alcohol. A small amount of 1 to 10% by weight of a polytetra-fluorethylene or other fluorocarbon polymer may be added to provide a source of fluorine ion to etch the surface. During firing, the binder is vaporized at low temperature. As the temperature is raised the sintering need only join the grains of primary metal since they are already wetted and coated with sintering metal which prevents formation of copper oxide.

These and many other features and attendant advantages of the invention will become apparent as the invention becomes better understood by reference to the following detailed description when considered in conjunction with the drawings.

DETAILED DESCRIPTION OF THE INVENTION

Figure 1:
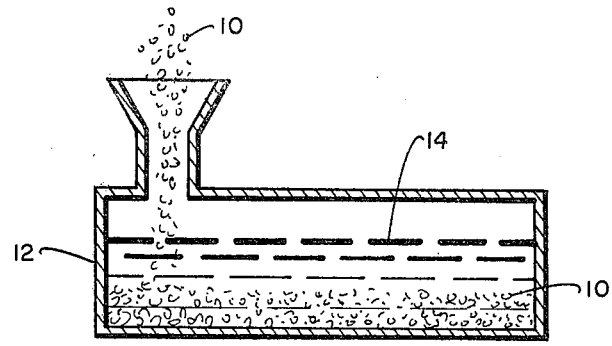
FIG. 1 is a schematic view of an apparatus for forming the metal coated powders.
Figure 2:
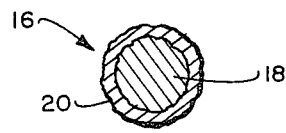
FIG. 2 is an enlarged sectional view of the coated powder of the invention.

Referring now to FIG. 1, the coated frit particles are fabricated by an electroless process. The particles 10 are added to tank 12 containing a solution 14 of the coating reagent. After a suitable period of reaction a coated particle 16 as shown in FIG. 2 is removed from the tank. The particle 16 has a core 18 of low cost, conductive, normally oxidizable metal such as nickel or copper or their alloys and a thin coating 20 of a sinterable metal having a melting temperature at least 50° C. lower than the core metal.

There are many suitable electroless reaction schemes available for forming the coating solution. The electroless solution may operate by a deposition reaction in which the solution contains a reducing agent which reacts with the source of sinterable metal or the solution may operate by chemical displacement. Many suitable coating solutions are used conventionally in industry. One such commercially available solution is a displacement tin plating bath which is used in printed circuit board manufacture. The bath has a low pH below about 1 and results in a thin pin-hole free coating of tin bonded to a copper surface. Other electroless coating solutions deposit a coating of a metal from a solution of the metal salt containing a reducing agent such as sodium hypophosphite and a buffer such as a lactate or on acetate salt.

In a particular example of practice, approximately 15 grams of copper powder (5–20 microns in diameter) were tin plated using Tinposit LT-26 (Shipley Co.) coating solution containing 150 grams of tin salt, 50 ml of HCl and 850 ml of water. Placement of the copper powder in a 155–165° F. bath for 5–10 minutes, hot rinsing for 3–5 minutes at 140°–160° F. and a cold rinse for 2–5 minutes results in the removal of the dense dark-red copper oxide coating and replacement with approximately a 0.75 micron thick coating of tin. Appearance of the plated powder was silver in color. Microscopic examination did not reveal any pin-holes.

Figure 3:
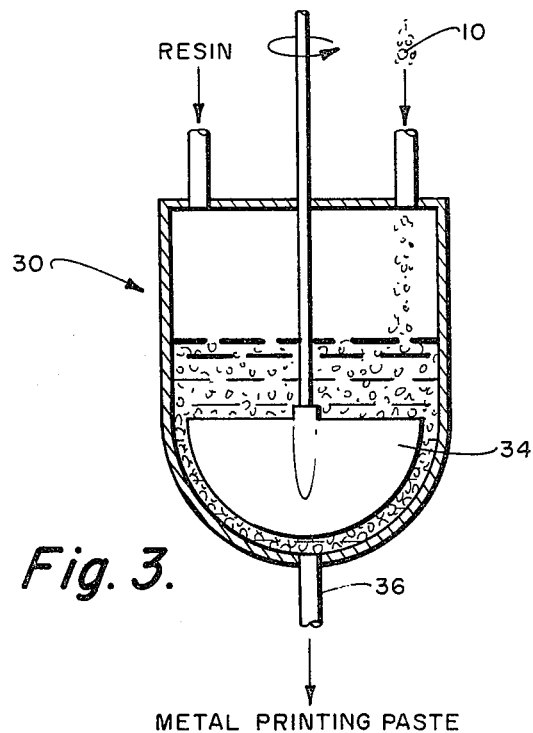
FIG. 3 is a schematic view of an apparatus forming a screenable, printing paste in accordance with the invention.

Referring now to FIG. 3, a screenable paste of this powder is formed by adding resin and the powder to a blending apparatus 30 such as a mixing tank containing a blade mixer 34. A suitable screenable printing ink for use in the invention would contain 23% of an acrylic-polyvinyl alcohol binder, 72% of the tin coated copper particles and 5% of Teflon (poly-tetrafluorethylene). After a suitable mixing period to form a paste like consistency, a screenable metalization ink is recovered through outlet 36.

Figure 4:
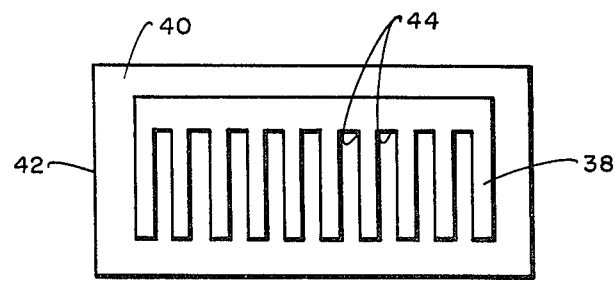
FIG. 4 is a schematic view of a mask superimposed on the front surface of a photovoltaic device.
Figure 5:
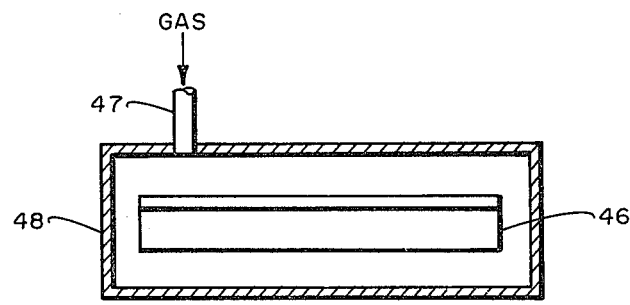
FIG. 5 is a schematic view of an apparatus for firing the pattern of paste to form an electrode.

Referring now to FIG. 4, the paste is applied to the surface of a screen 38 positioned on the top surface 40 of a doped silicon blank 42. A squeegee is applied to the screen to force the paste through the openings 44 to coat a pattern of ink on the surface. The screened blank 46 is placed in an oven 48 and fired at a temperature of at least 400° C., preferably about 500° C., for several minutes, in order to vaporize the binder and deposit a copper electrode pattern on the surface of the device. During firing it is preferred to use an inert or reducing atmosphere introduced through inlet 47 to further prevent formation of copper oxides. During firing, the surface of the metal particles are prevented from oxidation by means of a coating of the tin metal. The metal readily wets the surface and the sintering need only join the grains to each other to form continuous lines. Since the process can be performed at much lower temperature and in a shorter time there is less problems with diffusion of copper into the surface of the device to impair or destroy the rectifying junction.

Figure 6:
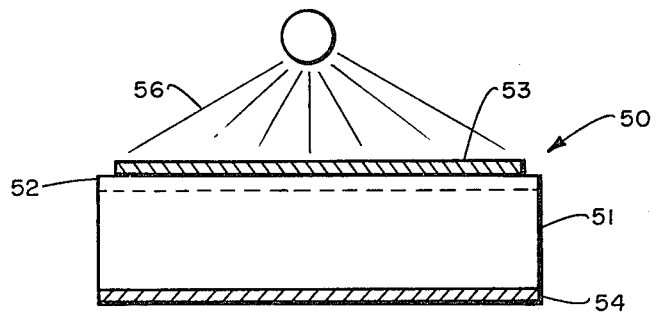
FIG. 6 is a sectional view of a photovoltaic device containing an electrode formed in accordance with the invention.

Referring now to FIG. 6, the completed photovoltaic device 50 generally consists of a sheet or wafer 51 of a semi-conductor material such as boron or aluminum doped P-type silicon containing a thin N-type junction layer 52 generally from 800 to 100 Angstroms below the front surface. Generally the junction layer or region contains phosphorous atoms. A front grid collecting contact 53 is provided on the front surface in accordance with the invention and a rear contact electrode 54 is provided on the back surface. When incident, solar radiation 56 is applied to the front surface, electrical carriers are generated in the device giving rise to a voltage differential across the junction. If the front and back electrodes 53 and 56 are connected through a resistor, or other load electric current will flow.

Other aspects of the invention relate to the application of an antireflective (AR) coating such as an evaporated or sprayed $SiO_x$ layer. This layer will isolate the oxidizable copper from the environment. The flux containing electrode contact of the invention should be readily solderable to form connections without the need to use fluxing agents.

It is to be realized that only preferred embodiments of the invention have been described and that numerous substitutions, modifications and alterations are permissible without departing from the spirit and scope of the invention as defined in the following claims.

I claim:

1. A method of forming a contact electrode on the surface of an electrical device comprising the steps of:
   (1) applying an ink including grains of a conductive, oxidizable, base metal to said surface, said grains containing a coating of a lower melting, sinterable, non-oxidizing metal and being dispersed in a liquid vehicle containing a polymer vaporizable at the temperature of sintering and a minor amount of a vaporizable, fluorocarbon polymer;
   (2) heating said surface to vaporize said polymer and said fluorocarbon polymer to etch said surface and to sinter said grains so that they flow to form an adherent, continuous, conductive, contact electrode.

2. A method according to claim 1 in which the grains are applied to the surface in a predetermined pattern.

3. A method according to claim 2 in which the pattern is formed by placing a mask containing openings in the form of said pattern to said surface before step (1).

4. A method according to claim 1 in which the ink is screened through said mask by means of a roller.

5. A method according to claim 4 in which the ink contains 50 to 85% by weight of metal grains.

6. A method according to claim 5 in which the ink contains 15 to 45% by weight of liquid vehicle comprising a polymer vaporizable at the temperature of firing and 1 to 10% of a fluorocarbon polymer.

7. A method according to claim 6 in which the polymer comprises an acrylic polymer and the fluorocarbon is polytetrafluoroethylene.

8. A method according to claim 1 in which the device is a photovoltaic device, the base metal is copper or nickel and the flux metal is selected from the group consisting of tin, lead, zinc, bismuth or cadmium.

9. A method according to claim 8 in which the base metal is copper and the flux metal is tin.

10. A method according to claim 8 in which the grains have a particle size from 1 to 100 microns.

11. A method according to claim 1 in which the grains are coated with flux metal by an electroless process.

* * * * *